United States Patent [19]
Chien

[11] Patent Number: 5,895,256
[45] Date of Patent: Apr. 20, 1999

[54] METHOD FOR MANUFACTURING LOCOS STRUCTURE

[75] Inventor: Sun-Chieh Chien, Hsinchu, Taiwan

[73] Assignee: United Microelectronics Corporation, Taiwan

[21] Appl. No.: 08/997,448

[22] Filed: Dec. 23, 1997

[30] Foreign Application Priority Data

Oct. 18, 1997 [TW] Taiwan ................... 86115359

[51] Int. Cl.$^6$ ................................... H01L 21/76
[52] U.S. Cl. ................. 438/439; 438/773; 427/248.1; 427/255.7
[58] Field of Search ............... 427/248.1, 255.4, 427/255.7; 438/439, 773; 148/DIG. 117, DIG. 85, DIG. 86

[56] References Cited

U.S. PATENT DOCUMENTS 5,502,009  3/1996  Lin .................. 438/439
5,504,034  4/1996  Rapisarda ........... 438/439
5,567,645  10/1996  Ahn et al. .......... 438/439

Primary Examiner—Roy V. King
Attorney, Agent, or Firm—Rabin & Champagne, P.C.

[57] ABSTRACT

A method for forming a LOCOS structure comprising the steps of providing a substrate, then forming a mask layer above the substrate. Next, the mask layer is patterned to form an opening having a depth not more than the mask layer. Subsequently, the mask layer is patterned to form an active device region exposing the substrate that lies outside the area, wherein the opening is within the active device region. Hence, a mask layer having a thicker peripheral section and a thinner middle section over the active device region is formed. Finally, a dielectric layer is formed over the expose substrate to serve as a device isolation structure. This invention provides a thin mask layer over the active device area to prevent the occurrence of excessive stresses, and hence improve the quality of subsequently formed gate oxide layer. On the other hand, this invention also provides a thick mask layer at the peripheral region of the active device area, thereby preventing the lengthening of the bird's beak region due to a thin mask layer.

19 Claims, 7 Drawing Sheets

METHOD FOR MANUFACTURING LOCOS STRUCTURE

BACKGROUND OF THE INVENTION

1. Field of Invention

The present invention relates to a method for manufacturing a LOCOS structure. More particularly, the present invention relates to a method for manufacturing a LOCOS structure that has a reduced bird's beak area.

2. Description of Related Art

In the manufacturing of semiconductors, in order to avoid short-circuiting of adjacent devices, isolating structures are often constructed to separate the devices. The most common method for device isolation, besides using shallow trench isolation, is the local oxidation isolation method or LOCOS for short.

FIGS. 1A through 1C are cross-sectional views showing the progression of manufacturing steps in forming a conventional LOCOS structure. First, as shown in FIG. 1A, a pad oxide layer 11 is formed over a substrate 10 in oxidation process by placing the substrate in a furnace and heated in an atmosphere of oxygen. Next, a low pressure vapor deposition (LPCVD) method is used to form a silicon nitride layer 12 over the pad oxide layer 11. Conventional photolithographic and etching processes are then used to pattern the silicon nitride layer 12 into a structure as shown in FIG 1B. Principally, the silicon nitride layer 12 and the silicon oxide layer 11 are used mainly as a mask for forming the LOCOS structure and defining the active regions. Subsequently, impurity ions are implanted into the substrate, and then a wet oxidation method is used to grow a layer of field oxide 13 over the substrate. Because water and oxygen molecules are difficult to penetrate through a silicon nitride barrier, no silicon dioxide layer is formed above the silicon nitride covered substrate. For other areas where there is no silicon nitride coverage, a surface layer of the substrate will be oxidized to form a silicon dioxide layer. However, since water and oxygen molecules is able to diffuse horizontally near the edge of the silicon nitride layer, a portion of the substrate beneath the nitride edge will be oxidized to a varying degrees. Therefore, a final structure known as a bird's beak 13 is formed as shown in FIG 1C.

In practice, the formation of the aforementioned bird's beak shaped field oxide layer will cause problems in subsequent processes. For example, when the thickness ratio of silicon nitride/pad oxide is reduced, the transition areas where the bird's beak encroaches upon will be lengthened. This problem will intensify because of the constant miniaturization of devices nowadays. FIG. 2 is a top view of FIG 1C. From the sketch, it can be seen that the bird's beak structure occupies a large portion at the side of the active device region. On the other hand, if the silicon nitride/pad oxide thickness ratio is increased instead, then tensile stress created by the silicon nitride layer on the oxide layer will be increased considerably. Consequently, the quality of the gate oxide layer produced by the process will be poor.

In light of the foregoing, there is a need to provide an improved method of forming a LOCOS structure.

SUMMARY OF THE INVENTION

Accordingly, the present invention is directed to provide a method for controlling the thickness ratio of silicon nitride layer versus pad oxide layer such that the thickness ratio is not too low as to cause a long bird's beak, but is not so high as to produce an oxide layer having too much stress in it.

To optimize the silicon nitride layer/pad oxide layer thickness ratio, this invention provides a different silicon nitride layer/pad oxide layer thickness ratio in different device areas. In other words, thickness of the silicon nitride layer varies in different part of the device areas. The scheme is to form thicker silicon nitride layer in regions where a short bird's beak is desired, and a thinner silicon nitride layer is formed in the device area where too much stress in the oxide layer can form poor gate oxide layer.

To achieve these and other advantages and in accordance with the purpose of the invention, as embodied and broadly described herein, the invention provides a method for forming a LOCOS structure comprising the steps of providing a substrate. Then, a pad oxide layer and a mask layer is formed above the substrate, wherein the mask layer can be a layer of silicon nitride, or a composite layer including a silicon nitride layer, an oxide layer and a silicon nitride layer. Thereafter, the mask layer is patterned and etched to form an opening having a depth not thicker than the mask layer, and wherein the opening is located inside the designated active device area. Next, the mask layer is patterned and etched to form the active device area exposing the substrate outside the active device region. Hence, a mask layer having a thicker peripheral section surrounding a thinner middle section is formed. Finally, a silicon oxide layer is formed over the exposed substrate to complete the device isolation structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
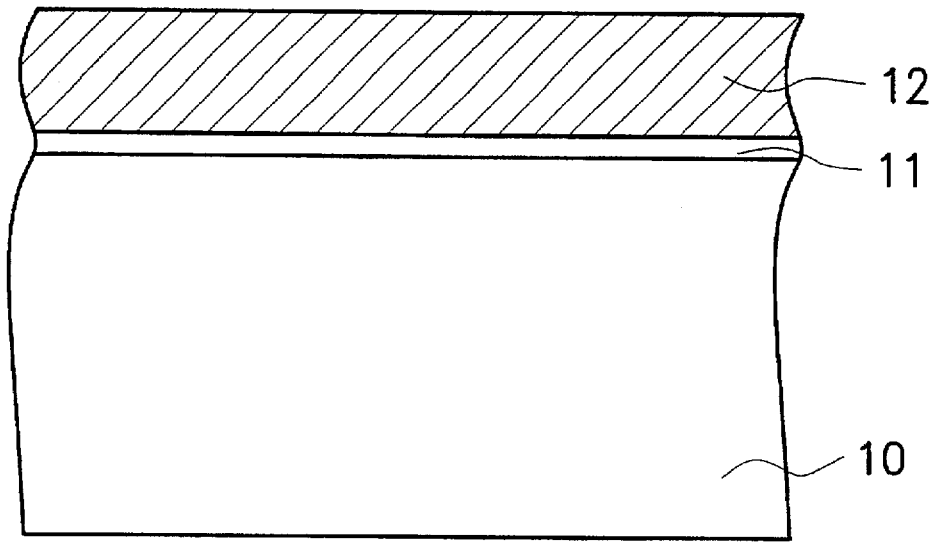
FIGS. 1A through 1C are cross-sectional views showing the progression of manufacturing steps in forming a conventional LOCOS structure.
Figure 1B:
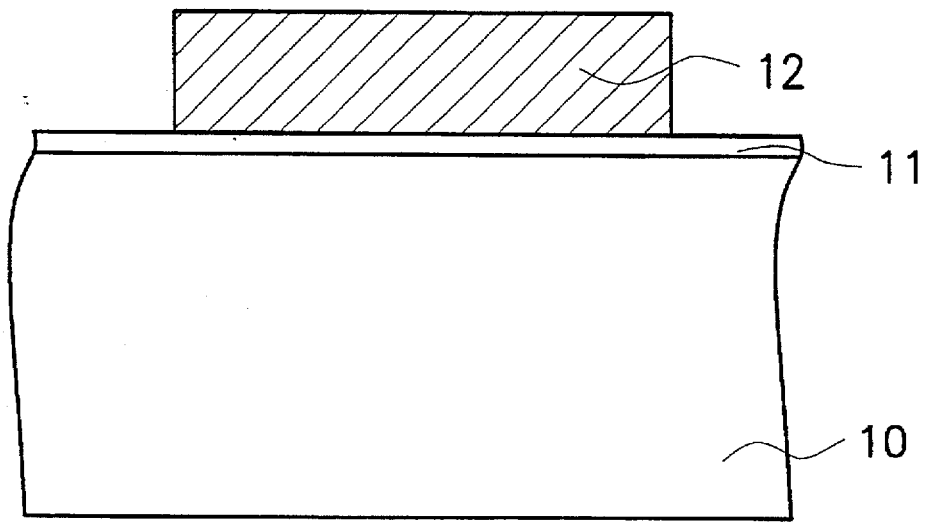
Figure 1C:
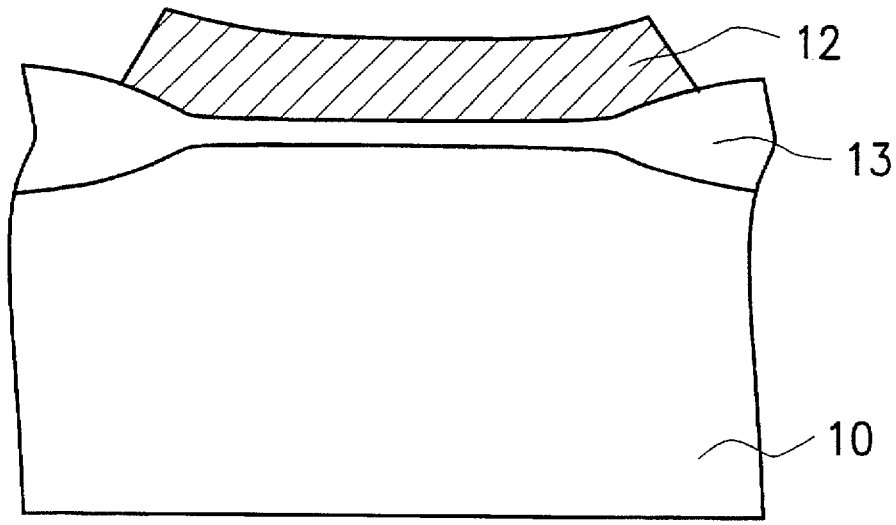
Figure 2:
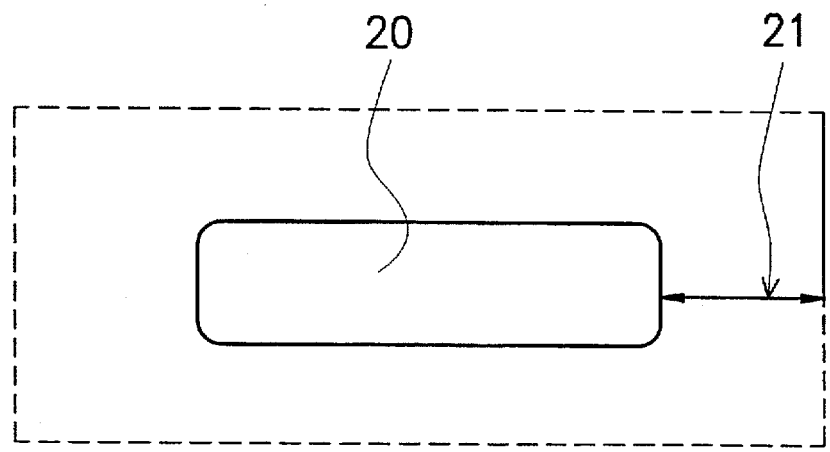
FIG. 2 is a top view of FIG. 1C.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3D are cross-sectional views showing the progression of manufacturing steps in forming a LOCOS structure according to a first embodiment of this invention.

Figure 3A:
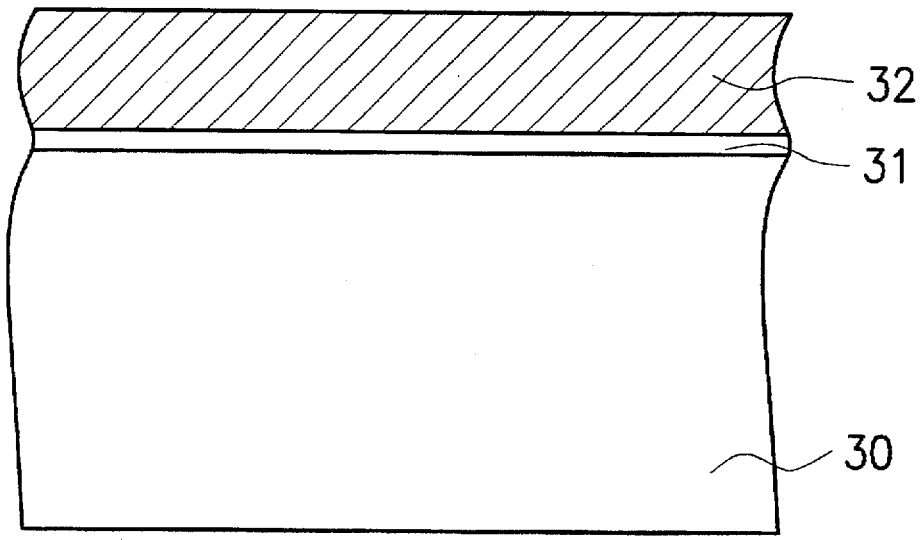
FIGS. 3A through 3D are cross-sectional views showing the progression of manufacturing steps in forming a LOCOS structure according to a first embodiment of this invention.

First, as shown in FIG. 3A, an oxide layer 31 is formed above a substrate 30. Then, a mask layer 32 is formed above the oxide layer 31. The oxide layer 31 preferably having a thickness of about 60 Å to 200 Å can be formed using, for example, a thermal oxidation method. The mask layer 32 preferably having a thickness of about 1500 Å to 3000 Å can be a silicon nitride layer formed by a low pressure chemical vapor deposition method. The oxide layer functions as an intermediate cushioning layer or pad oxide layer for lowering the stress at the transition region between the silicon nitride layer and the substrate layer.

Figure 3B:
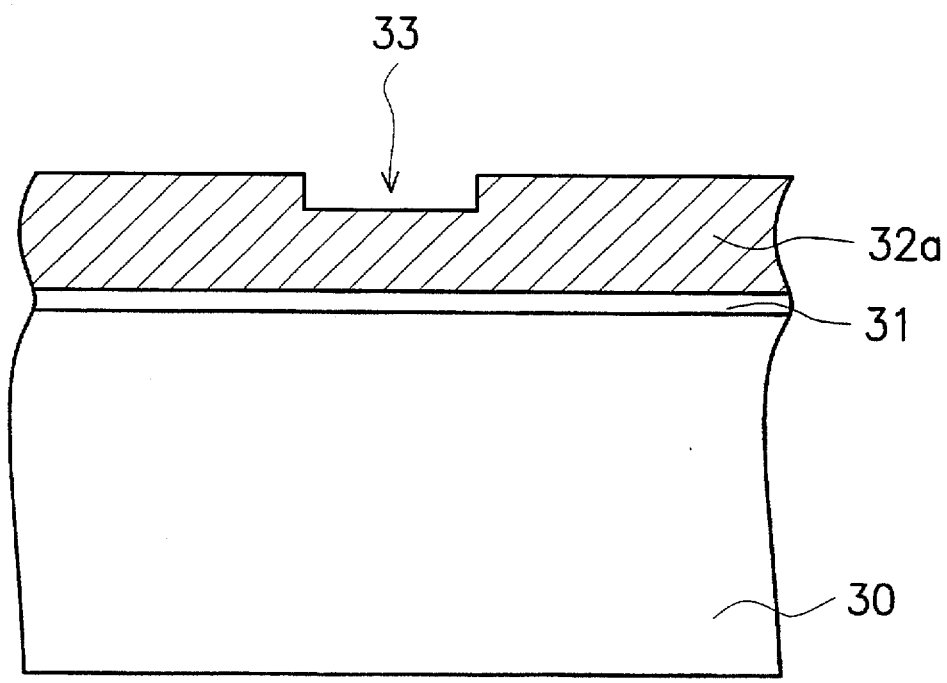

Next, as shown in FIG. 3B, conventional photolithographic and etching processes are used to form an opening 33 above the mask layer 32 within the desired active device area. Furthermore, the depth of the opening 33 should not be too deep as to expose the substrate below. Hence, a mask layer 32a having a thicker peripheral section surrounding a thinner middle section is formed. For example, an anisotropic plasma etching method can be used to etch the mask layer 32, and that the opening 33 preferably has a depth of between 500 Å to 2000 Å.

Figure 3C:
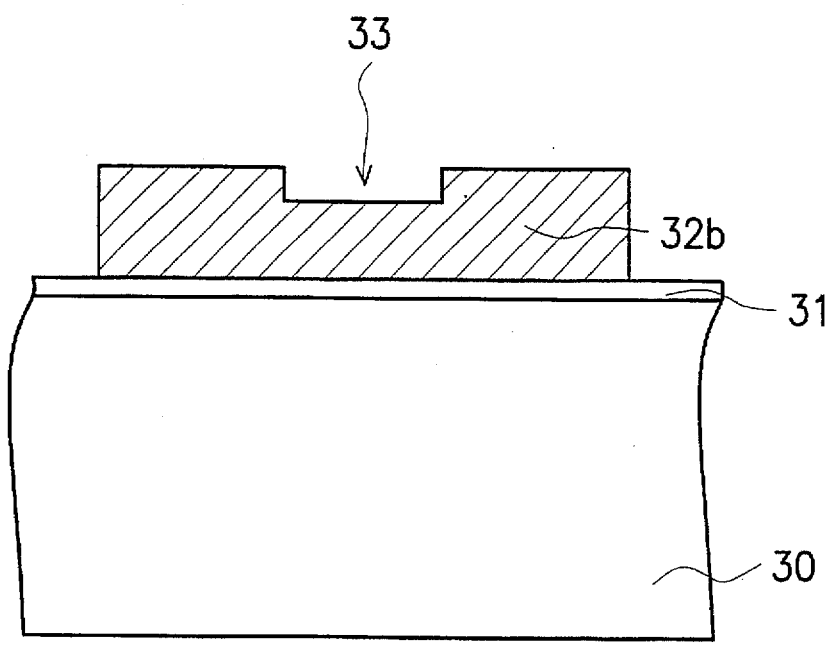

Next, as shown in FIG. 3C, conventional photolithographic and etching techniques are again used to pattern the mask layer 32a exposing the substrate surrounding the desired active device area and forming a mask layer 32b. In effect, the mask layer 32a with an opening 33 on top now covers the desired active device area. The mask layer surrounding the desired active device area can be removed using, for example, a plasma etching method.

Finally, a wet oxidation method is used to oxidize the exposed substrate 30 to form a field silicon oxide layer 34 preferably having a thickness of about 2500 Å to 5000 Å.

FIGS. 4A through 4D are cross-sectional views showing the progression of manufacturing steps in forming a LOCOS structure according to a second embodiment of this invention.

Figure 4A:
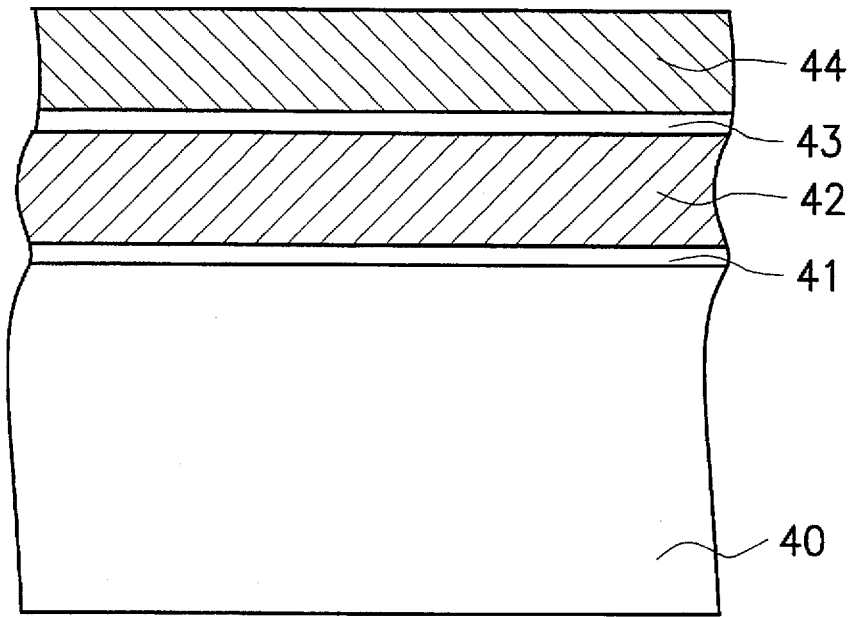
FIGS. 4A through 4D are cross-sectional views showing the progression of manufacturing steps in forming a LOCOS structure according to a second embodiment of this invention.

First, as shown in FIG. 4A, an oxide layer 41 is formed above a substrate 40, and then a silicon nitride layer 42 is formed over the oxide layer 41. The oxide layer 41 preferably having a thickness of about 60 Å to 200 Å can be formed using, for example, a thermal oxidation method. The silicon nitride layer 42 preferably having a thickness of about 700 Å to 1500 Å can be formed using, for example, a low pressure chemical vapor deposition (LPCVD) method. The oxide layer 41 serves as a pad oxide layer for lowering the stress level between a silicon nitride layer and a substrate. Thereafter, a silicon oxide layer 43 is formed over the silicon nitride layer 42, and then a silicon nitride layer 44 is formed over the oxide layer 43. The silicon oxide layer 43 preferably having a thickness of about 100 Å to 200 Å can be formed using, for example, a chemical vapor deposition method. The silicon nitride layer 44 preferably having a thickness of about 700 Å to 1500 Å can be formed using, for example, a low pressure chemical vapor deposition (LPCVD) method. The silicon nitride layer 42, the silicon oxide layer 43 and the silicon nitride layer 44 together constitute a mask layer.

Figure 4B:
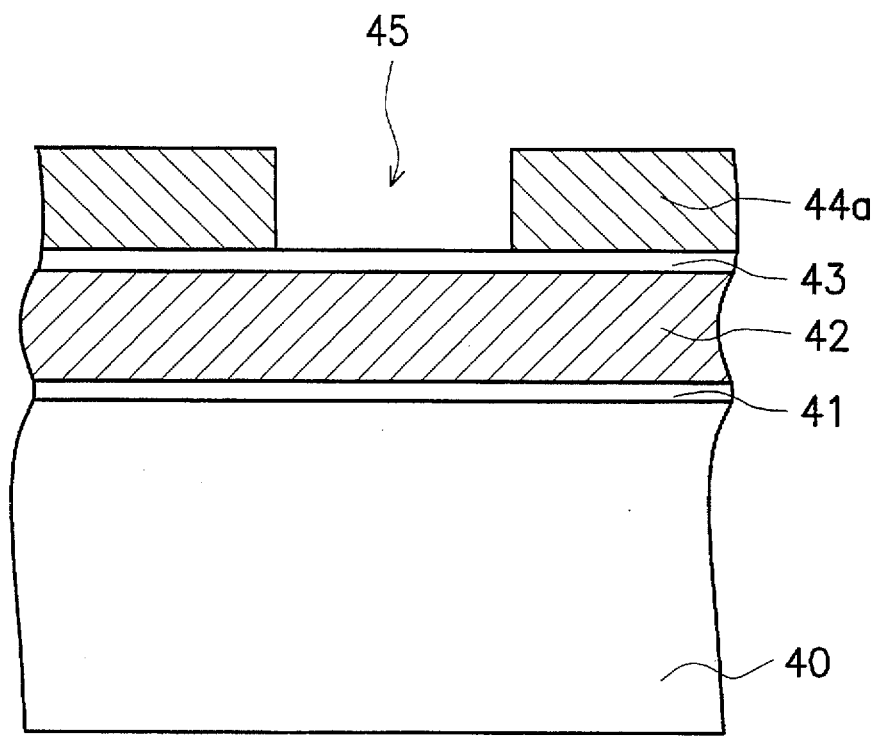

Next, conventional photolithographic and etching techniques are used to pattern the silicon nitride layer 44 forming an opening 45. In other words, the silicon nitride layer 44 is selectively etched using the silicon oxide layer 43 as an etching stop layer to form a silicon nitride layer 44a as shown in FIG. 4B. For example, an anisotropic plasma etching method can be used to etch the silicon nitride layer 44.

Figure 4C:
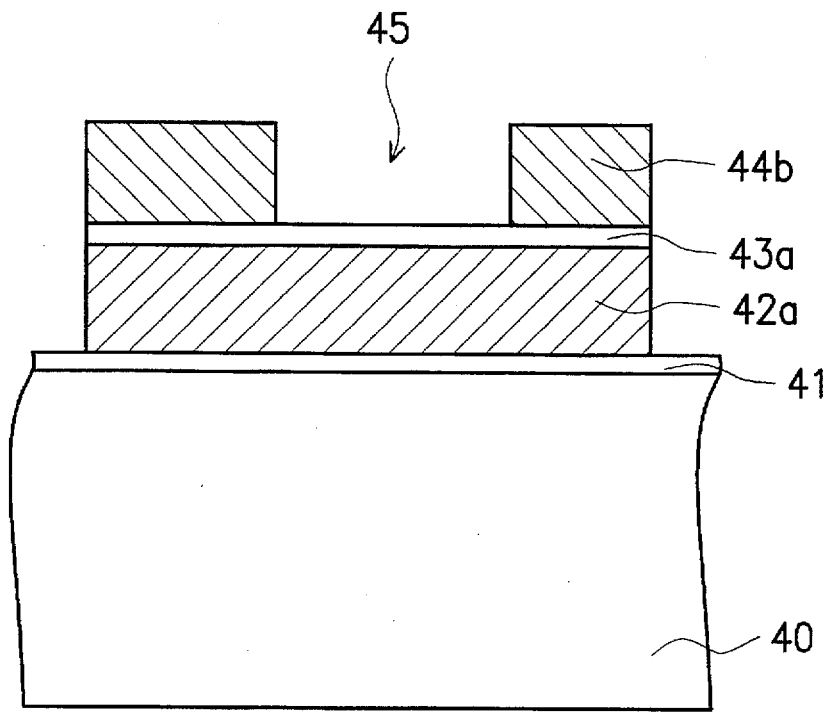

Next, as shown in FIG. 4C, conventional photolithographic and etching processes are again used to pattern the active device area. The silicon nitride layer 44a, the silicon oxide layer 43 and the silicon nitride layer 42 are sequentially etched to form a silicon nitride layer 44b, a silicon oxide layer 43a and a silicon nitride layer 42a exposing the substrate around the active device area. In effect, the mask layer with an opening 45 now covers the desired active device area. The composite mask layer surrounding the desired active device area can be removed using, for example, a plasma etching method.

Finally, a wet oxidation method is used to oxidize the exposed substrate 40 to form a field silicon oxide layer 46 preferably having a thickness of about 2500 Å to 5000 Å.

Figure 3D:
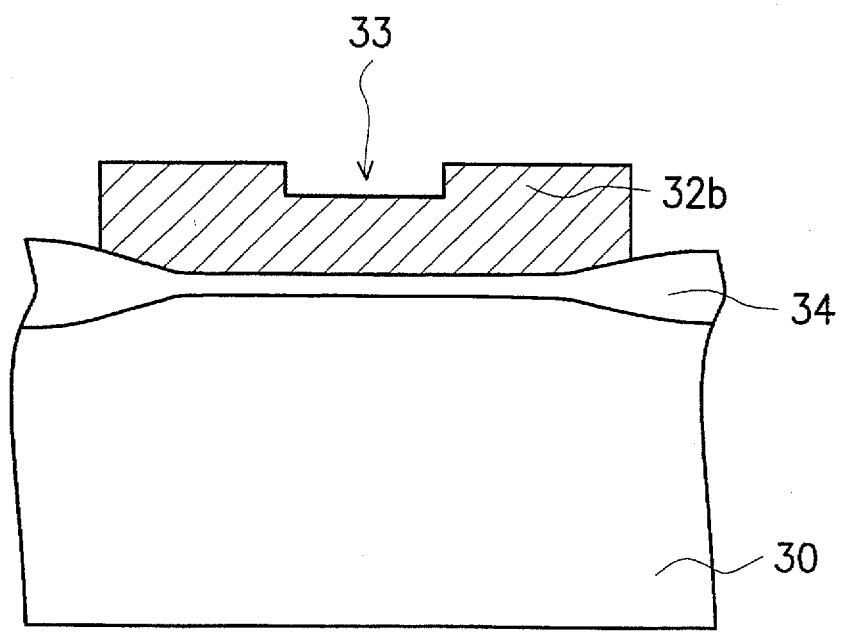
Figure 4D:
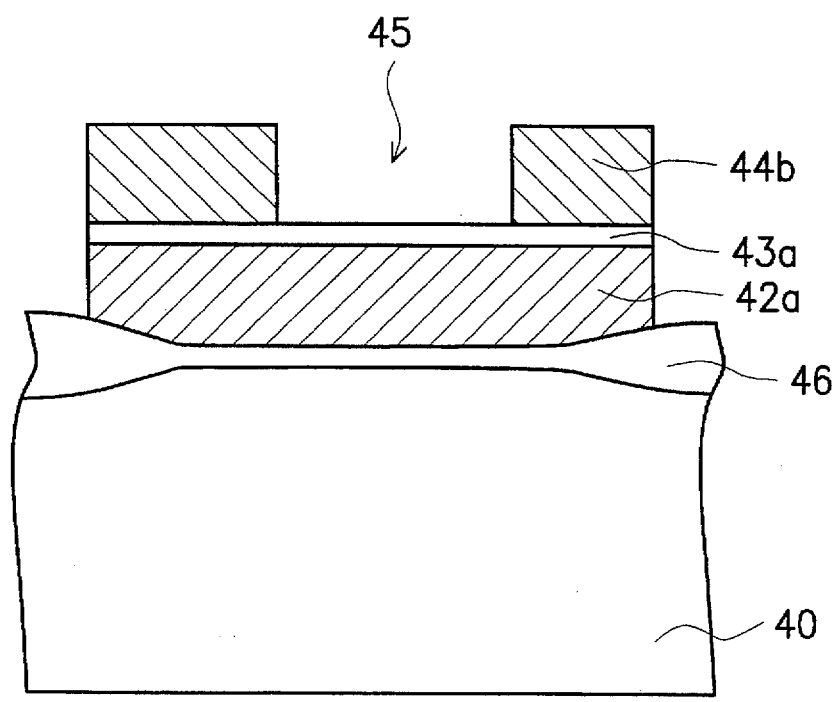
Figure 5:
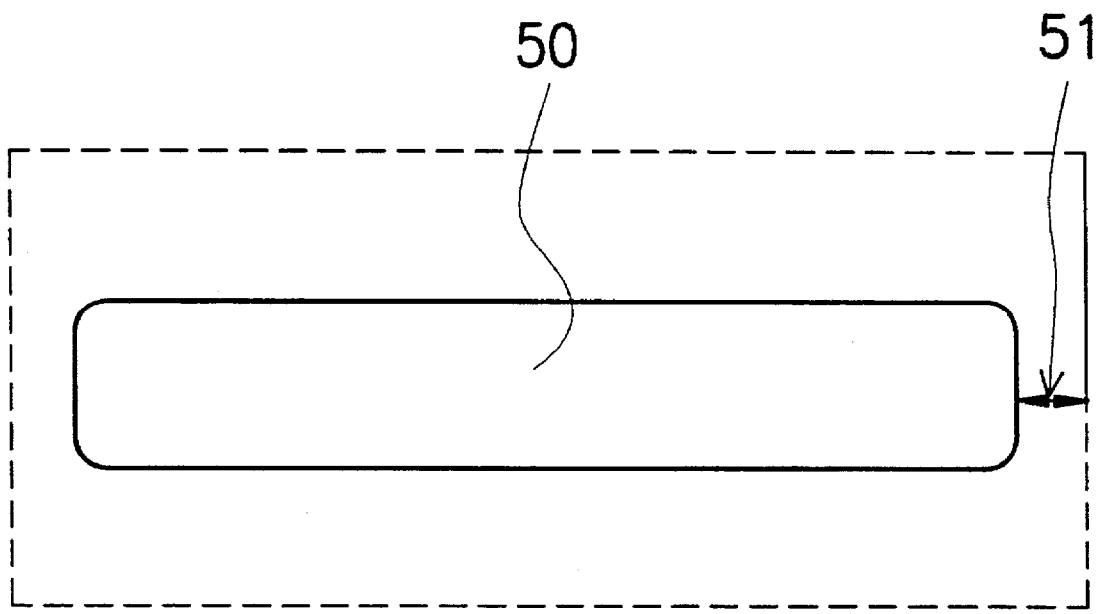
FIG. 5 is a top view of FIG. 3D and FIG. 4D.

FIG. 5 is a top view of FIG. 3D and FIG. 4D. As shown in FIG. 5, the extension of the bird's beak 51 on the side of the active device region 50 fabricated according to this invention is narrower than that produced by a convention technique.

As a summary, this invention provides a thinner mask layer over the active device area to prevent the formation of excessive stress due to a thick mask layer, and hence can improve the quality of subsequently formed gate oxide layer. On the other hand, this invention also provides a thicker mask layer at the peripheral region of the active device area, thereby preventing the lengthening of the bird's beak region due to a thin mask layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a LOCOS structure, comprising the steps of:

providing a substrate;

forming a mask layer above the substrate;

patterning the mask layer to form an opening, wherein the opening has a depth not too deep to expose the substrate, and the opening is formed above an active device region;

patterning the mask layer to defined the active device region and expose the substrate surrounding the active device region; and forming a silicon oxide layer in the exposed portion of the substrate.

2. The method of claim 1, wherein after the step of providing a substrate but before the step of forming a mask layer, further includes the step of forming a pad oxide layer over the substrate.

3. The method of claim 2, wherein the step of forming the pad oxide layer includes a thermal oxidation method.

4. The method of claim 3, wherein the pad oxide layer has a thickness of about 60 Å to 200 Å.

5. The method of claim 1, wherein the step of forming the mask layer includes depositing silicon nitride.

6. The method of claim 5, wherein the step of forming the mask layer includes depositing silicon nitride to a thickness of about 1500 Å to 3000 Å.

7. The method of claim 1, wherein the opening has a depth of about 500 Å to 2000 Å.

8. The method of claim 1, wherein the step of patterning the mask layer to define the active device region includes etching away a portion of the mask layer that lies outside the active device region to expose the substrate.

9. The method of claim 1, wherein the step of forming the silicon oxide layer includes a thermal oxidation method.

10. The method of claim 9, wherein the silicon oxide layer has a thickness of about 2500 Å to 5000 Å.

11. The method of claim 1, wherein the step of forming the mask layer includes depositing a first silicon nitride layer, an oxide layer and a second silicon nitride layer.

12. The method of claim 11, wherein the step of forming the mask layer further includes the substeps of:

forming a first silicon nitride layer over the substrate;

forming an oxide layer over the first silicon nitride layer; and forming a second silicon nitride layer over the oxide layer.

13. The method of claim 11, wherein the first silicon nitride layer has a thickness of about 700 Å to 1500 Å.

14. The method of claim 11, wherein the second silicon nitride layer has a thickness of about 700 Å to 1500 Å.

15. The method of claim 11, wherein the step of forming the oxide layer includes depositing oxide to a thickness of about 100 Å to 200 Å using a chemical vapor deposition method.

16. The method of claim 1, wherein the step of patterning the mask to form an opening includes using photolithographic and etching processes to form an opening in the second silicon nitride layer.

17. The method of claim 16, wherein the step of etching an opening in the silicon nitride layer includes using the oxide layer as an etching stop layer.

18. The method of claim 1, wherein the step of patterning the mask layer to form the active device region includes etching a portion of the second silicon nitride layer, the oxide layer and the first silicon nitride layer that lies outside the active device region to expose the substrate.

19. The method of claim 1, wherein the step of forming the mask layer includes constructing a mask layer having a thinner cross-section near the middle portion of the active device region than its peripheral portion.

* * * * *